United States Patent [19]

Lankar et al.

[11] Patent Number: 4,630,291

[45] Date of Patent: Dec. 16, 1986

[54] EXTERNALLY SYNCHRONIZED TIMEBASE

[75] Inventors: André Lankar, Paris; Alain Lalanne, Asnieres, both of France

[73] Assignee: Compagnie Industrielle des Telecommunicat., Paris, France

[21] Appl. No.: 613,985

[22] Filed: May 25, 1984

[30] Foreign Application Priority Data

May 27, 1983 [FR] France ................................. 83 08774

[51] Int. Cl.[4] .......................... H04L 7/04; H03L 7/00
[52] U.S. Cl. .................................... 375/107; 375/108; 375/120; 455/51; 331/11; 331/17; 328/63; 328/72
[58] Field of Search ............... 375/107, 108, 111, 106, 375/119, 120; 328/72, 63; 371/36; 455/51; 331/11, 17

[56] References Cited

U.S. PATENT DOCUMENTS

| | | | |
|---|---|---|---|
| 3,411,103 | 11/1968 | Deman et al. ......................... | 331/17 |
| 4,005,266 | 1/1977 | Lehr et al. ............................ | 375/107 |
| 4,027,274 | 5/1977 | Fukui et al. ........................... | 331/17 |
| 4,107,623 | 8/1978 | Graf et al. ............................. | 331/11 |
| 4,163,946 | 8/1979 | Alberts .................................. | 328/63 |
| 4,164,629 | 8/1979 | Ollivier et al. ......................... | 331/2 |
| 4,489,412 | 12/1984 | Duplessis et al. ...................... | 370/16 |

FOREIGN PATENT DOCUMENTS 2938043 4/1981 Fed. Rep. of Germany .

Primary Examiner—Marc E. Bookbinder
Assistant Examiner—Andrew J. Te Lesz, Jr.
Attorney, Agent, or Firm—Sughrue, Mion, Zinn Macpeak & Seas

[57] ABSTRACT

A timebase adapted to be synchronized to an external clock comprises at least one generator incorporating a voltage-controlled oscillator adapted to be controlled by the result of comparing an external synchronization signal from an external clock with an output signal of the timebase. Each generator comprises at least one differential comparator receiving the external synchronization signal and the timebase output signal. It drives a summing circuit on the input side of the control input of the oscillator of the generator in question. The generator further comprises a calibration system comprising a threshold detector connected to the output of the phase comparator, a calibration voltage adjustment circuit connected between the threshold detector and a second input of the summing circuit, and a trigger circuit in and controlling the adjustment circuit.

5 Claims, 9 Drawing Figures

EXTERNALLY SYNCHRONIZED TIMEBASE

BACKGROUND OF THE INVENTION

1. Field of the Invention

The invention concerns timebases synchronized to an external clock, in particular those intended for use in digital telephone exchanges and more particularly the generators constituting these timebases.

2. Description of the Prior Art

It is conventional to use in telephone exchanges a central timebase delivering clock and synchronization signals to the various units through the intermediary of distribution means.

For reasons of security and reliability a timebase of this kind is of redundant design, comprising a plurality of identical generators, in most cases three in number.

In one known technique the generators utilize crystal-controlled oscillators with the frequency controlled by the application of a voltage and the temperature also controlled. Frequency and temperature control are obtained in the following manner:

- the oscillator housing is thermostatically controlled to limit the effect of temperature changes,
- the oscillator operating range is fixed by the application of a calibration voltage to the control input,
- drift is controlled by superimposing a synchronization voltage and the calibration voltage,
- synchronization may be achieved by superimposing internal and external synchronization.

Internal synchronization is achieved on the basis of the output signals of the oscillator itself and of the oscillators of the other generators of the timebase, by means of a majority decision logic circuit having inputs connected to receive the output signals from the generators. External synchronization is achieved by means of a link delivering an external clock. Internal synchronization must take precedence over external synchronization.

A timebase of this kind is described in French Pat. No. 2 390 856, corresponding to U.S. Pat. No. 4,164,629.

In use, the generators are thus mutually synchronized, but their power supplies and their means for distributing clock signals to the other units must be completely independent. For each utilization there is provided a distribution module comprising a majority decision logic circuit which receives the output signals from the generators.

A signal distribution system of this kind is described in French patent application No. 81 17643, corresponding to U.S. Pat. No. 4,489,412.

The known technique has disadvantages given the specifications currently applicable to telephone exchange timebases, particularly in the case of synchronized networks.

The generator frequency must be set with greater accuracy and must be very stable. Synchronization to an external clock calls for extremely fast correction of any phase shift, and may only vary the frequency within very narrow limits.

Fast phase control is needed in the event that the external clock may itself be subject to phase shifts, in the case of cut-off or switchover to a back-up clock, for example.

The object of the invention is to provide a timebase in which each generator provides a highly stable frequency, achieved through automatic control of the oscillator calibration, and the phase of which relative to an external clock can be modified very quickly.

SUMMARY OF THE INVENTION

The invention consists in a multi-generator externally synchronized timebase, with majority decision logic circuits receiving output signals from the generators of said timebase and each derivating an individual majority clock signal for one of said generators, which is controlled by an external synchronization signal and by an output signal of said timebase, each generator comprising:

a voltage-controlled oscillator, a first differential phase comparator having respective inputs connected to receive said external synchronization signal and said output signal of the timebase, a second differential phase comparator having respective inputs connected to receive said individual majority clock signal from said generator and an output signal from said voltage-controlled oscillator, a calibration system including a threshold detector connected to the output of said first comparator and a calibration voltage adjustment circuit connected to the output of said threshold detector, a summing circuit having its inputs respectively connected to the outputs of said calibration voltage adjustment circuit and of said first and second phase comparators and having its own output connected to a voltage control input of said voltage controlled oscillator.

Other objects and advantages will appear from the following description of an example of the invention, when considered in connection with the accompanying drawings, and the novel features will be particularly pointed out in the appended claims.

DESCRIPTION OF THE PREFERRED EMBODIMENTS

Figure 1:
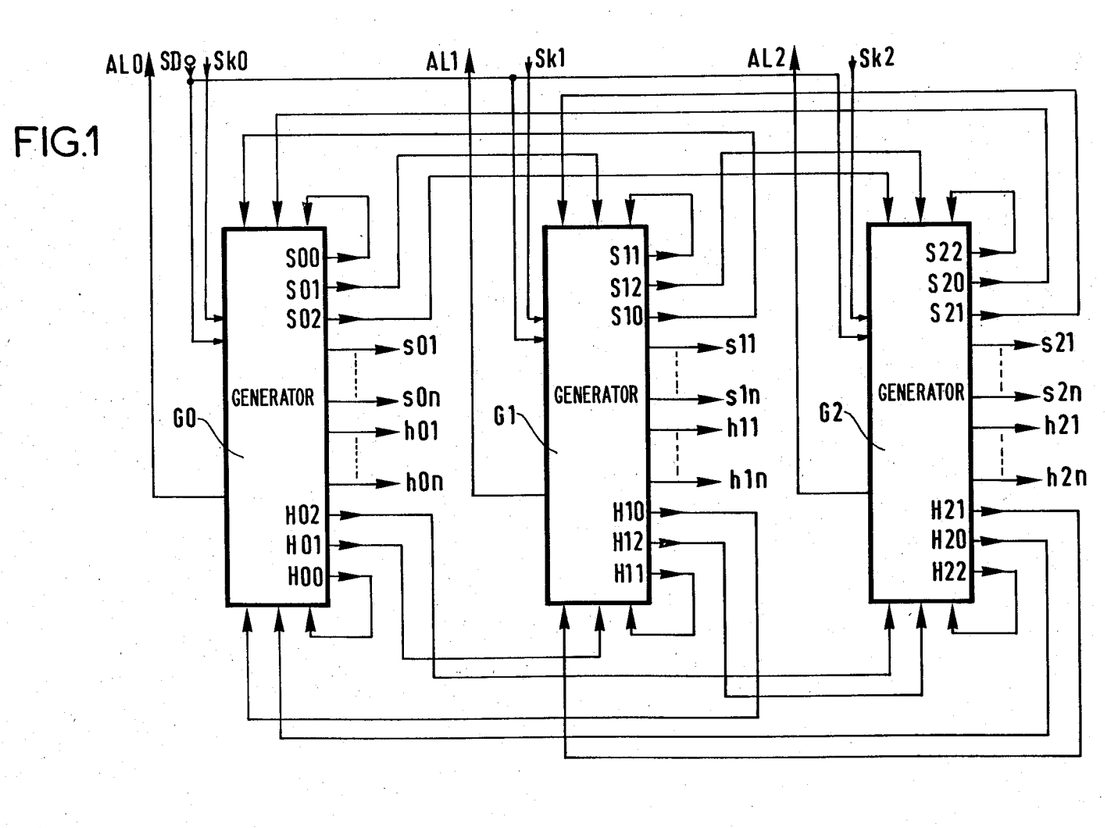
FIG. 1 shows a timebase comprising three generators.

The timebase shown in FIG. 1 comprises three generators G0, G1, G2.

Each generator delivers clock signals H and synchronization signals S and s and receives the clock and synchronization signals from the other two generators. Each generator also delivers an alarm signal AL0, AL1, AL2 in the event of a malfunction. These signals are routed to an alarm system (not shown). An external synchronization clock Sk0, Sk1, Sk2 is distributed to the three generators.

The clock and synchronization signal inputs and outputs are represented in FIG. 1 with the indexes i and j which respectively indicate the generator originating and the generator or unit receiving the signal in question. The signals comprise:

Hij: internal synchronization clock signal (H01, for example) exchanged between the generators, being a symmetrical signal at 4 MHz.

hij: clock signal to a unit (h0n, for example) with the same characteristics as the preceding signal.

Sij: synchronization signal effecting internal synchronization between generators (for example, S00 which in this instance is at a frequency of 8 kHz and has a duration of 244 ms).

sij: synchronization signal distributed to the units (s01, for example) with the same characteristics as the preceding signal.

skj: external synchronization signal intended for generator j (Sk0, for example) at a frequency of 8 kHz.

SD: signal associated with signals Skj and indicating a change of synchronization signal, as will be explained hereinafter.

Figure 2:
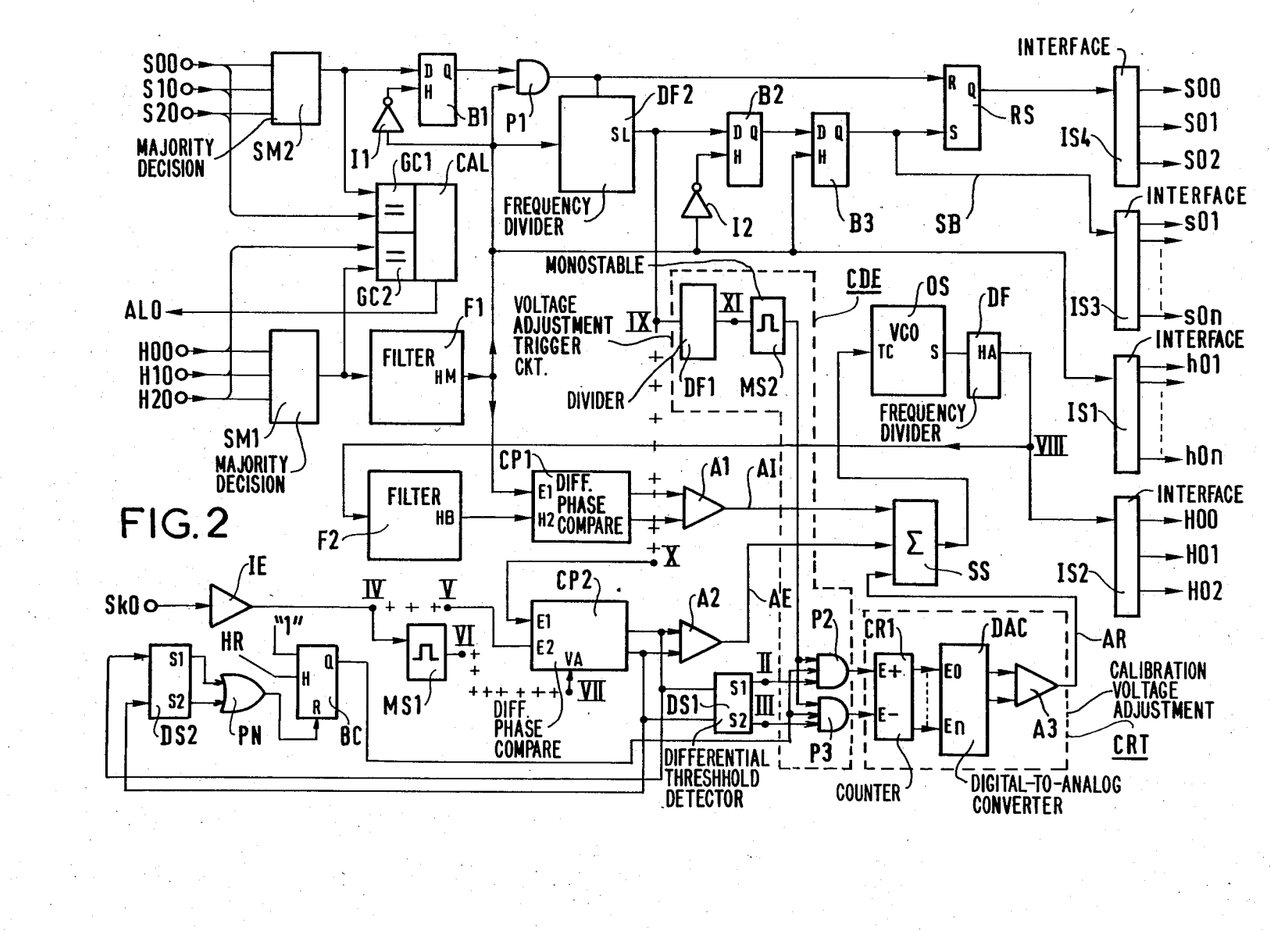
FIG. 2 is a schematic diagram of a generator.

FIG. 2 shows one embodiment of a generator, in this instance generator G0. As has been indicated, the three generators are identical. It will be assumed in the following that the links shown in dashed-line between points IV and V, VI and VII, IX and X are made.

The clock inputs H00 to H20 from the three generators G0, G1, G2 are connected to a majority decision circuit SM1 the output of which is active when at least two of its inputs are active. This output is connected to a filter circuit F1 the function of which is to eliminate spurious frequencies and to reshape the signal. The outpt of circuit F1 delivers a balanced majority clock signal HM at 4 MHz. This signal is delivered to the external units over the links h01 to h0n via an output interface IS1. The spuriae to be eliminated appear in particular when to output signals of the majority decision circuit SM1 are produced in the same cycle, if one of the generators is significantly phase-shifted relative to the other two.

An internal clock signal HA is delivered by a voltage-controlled oscillator OS via a frequency divider DF. An 8 MHz oscillator and a divider by two, in this instance formed by a flip-flop, may be used, for example. The signal HA is delivered to the outputs H00 to H02 via an interface IS2.

The voltage control input TC of the oscillator is connected to the output of a summing circuit SS controlled by internal synchronization signal AI, external synchronization signal AE and calibration signal AR as will be explained hereinafter.

The signal AI is delivered by a differential phase comparator CP1 to the output of which is connected a differential amplifier A1. The comparator CP1 receives on its input the majority clock signal HM and an internal clock signal HB from the output of a filter circuit F2 receiving the signal HA. The filter circuit F2 is identical to the circuit F1 and its function is to render the comparison system symmetrical; specifically, it equalizes the propagation times for signals HM and HB and eliminates the effect of temperature variations.

The synchronization signals s01 to S0n are delivered by an interface IS3 and are produced from a signal SB obtained by dividing down the signal HM. The division circuit comprises in series a frequency divider DF2 supplying a timebase output signal SL and two type D flip-flops B2 and B3.

The flip-flop B2 is activated by the signal HM inverted byy an inverter i2 and the flip-flop B3 is activated by the non-inverted signal HM.

The synchronization signals S00 to S20 are received at the input of a majority decision circuit SM2 of which the output is connected to the data input D of a flip-flop B1 activated by the signal HM inverted by an inverter I1. The output of the flip-flop B1 is connected by a gate P1 activated by the signal HM to an enable input of the divider DF2 and to the R input of an RS flip-flop. The S input of this RS flip-flop is connected to the output of the flip-flop B3. The output of the RS flip-flop is connected to an output interface IS4 which delivers the synchronization signals S00 to S02. The function of the flip-flop B1 is to synchronize the divider DF2 with the majority signal, and the RS flip-flop prevents generation of signals S00 to S02 in the event of disappearance of the signal HM.

External synchronization by means of a synchronization signal such as Sk0 is achieved by a phase comparator CP2 identical to the comparator CP1. One input of the comparator CP2 is connected to the output of the divider DF2 and the other is connected to the output of an interface IE receiving the synchronization signal Sk0.

The output of the comparator is connected to an amplifier A2 which delivers the synchronization signal AE.

The comparator CP2 must be disabled in the event of disappearance of the external synchronization signal Sk0 to enable the timebase to operate autonomously in this event. To this end, the output of the interface IE is connected to a monostable MS1 which controls the enable input VA of the comparator. The duration of the pulses delivered by the monostable MS1 is slightly greater than the period of the external synchronization signal Sk0.

The calibration signal AR is provided by a calibration system which modifies this signal AR when the phase difference indicated by the comparator CP2 exceeds a predetermined threshold.

To this end, the calibration system comprises a differential threshold detector DS1 connected to the outputs of the comparator CP2.

The detector DS1 comprises two outputs S1 and S2 connected to the inputs of a voltage adjustment trigger circuit CDE which controls a calibration voltage adjustment circuit CRT. The output S1 is activated when the local signal lags behind the signal Sk0 with a phase difference greater than the predetermined threshold. The output S2 is activated when the local signal leads with a phase difference greater than said threshold. The outputs S1 and S2 are respectively connected to the incrementing input E+ and the decrementing input E− of a counter CR1 through the adjustment trigger circuit CDE comprising control gates P2 and P3 (AND gates) which are enabled by the output signal SL divided down by a divider DF1 and applied to a monostable MS2. In the calibration voltage adjustment circuit, the outputs of weights 0 to n of the counter are connected to the inputs E0 to En of the same rank of a digital-to-analog converter DAC. The calibration signal AR is provided by an amplifier A3 connected to the output of the converter DAC.

Thus, the oscillator calibration signal is stored by means of counter CR1. To modify the calibration signal, in the event that the phase difference exceeds the threshold, the monostable MS2 is periodically activated, each pulse from the monostable incrementing or decrementing the counter.

In accordance with the invention, there is also provided a system for inhibiting the counter CR1 when the phase difference indicated by the comparator CP2 is excessive.

The purpose of this is to guard against significant drift affecting the external synchronization signal Sk0 not accompanied by an alarm indication.

In this case, it is beneficial to maintain the calibration unchanged without taking any account of the external synchronization signal Sk0 and to periodically check the drift so as to again enable the counter when it returns to an acceptable value.

To this end, the outputs of the comparator CP2 are connected to a second threshold detector DS2 of the same type as the first, but with a higher threshold. The gates P2 and P3 are controlled by the Q output of a type D flip-flop BC.

The outputs S1 and S2 of the detector DS2 are connected to a gate PN which controls resetting to zero of the flip-flop BC.

The clock input H of the flip-flop BC is activated by a signal HR which has a period of 8 seconds, for example and may be obtained by dividing down the signal HM.

Thus when the drift attains the triggering threshold of the detector DS2, the counter CR1 is disabled and the calibration is maintained unchanged. On each period of the signal HR the gates P2 and P3 are again opened. They are closed again only if the drift is still above the detector triggering threshold. If not, nornal operation of the automatic calibration system resumes.

The signal activating the monostable MS2 is provided by dividing down the output signal SL from the divider DF2 using a frequency divider DF1. For example, given a frequency of 8 kHz at the output of the divider DF2, a divider DF1 which divides by 19 yields an activation signal period of approximately one minute.

The generator G0 further comprises an alarm indication circuit CAL which sends the alarm signal AL0 when one of signals H00 to H20 or S00 to S20 is no longer in phase with the corresponding majority signal. To this end, the signals are received by groups of comparators GC1 and GC2 which may be based, for example, on exclusive-OR gates. A system of this kind is described in U.S. Pat. No. 4,164,629 previously referred to.

There will be described below by way of example one embodiment of the circuits constituting the generator.

Figure 3:
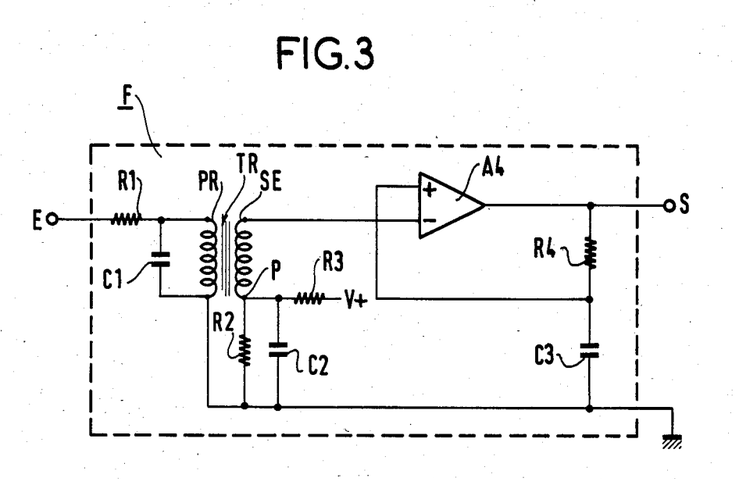
FIG. 3 shows a filter circuit.

The filter circuits F1 and F2 are, for example, of the kind shown in FIG. 3, each circuit F comprising a transformer TR and a differential amplifier A4. The primary PR of the transformer TR has one end connected to ground and the other end connected to a signal input E through a resistor R1. The filter consists of the primary PR and a capacitor C1 connected to the primary, and is tuned to the frequency of the 4 MHz clock signals. One end of the secondary SE is connected to the negative input of the amplifier A4 and the other end is connected to a point P, the DC voltage at which is set by a resistor bridge R2, R3 connected between a reference voltage V+ and ground. The center point P of the resistor bridge is connected to ground through a capacitor C2.

The output of the amplifier A4 is connected to the output S of the circuit F and also to the positive input through a resistor R4.

A capacitor C3 connects the positive input of the amplifier A4 to ground.

Figure 4:
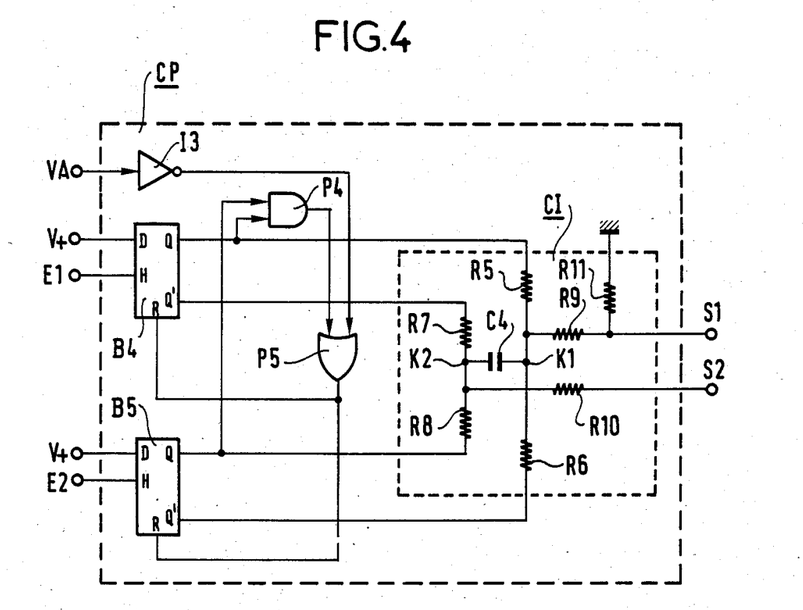
FIG. 4 shows a differential phase comparator.

The phase comparators CP1 and CP2 each comprise two input type D flip-flops B4, B5 and an integrator circuit (FIG. 4). The data input D of the flip-flops B4, B5 is connected to the voltage V+. The clock input H of the flip-flop B4 is connected to the input E1 of the comparator and the input H of the flip-flop B5 is connected to the input E2 of the comparator.

The reset inputs R of the two flip-flops are controlled by an OR gate P5 in series with an OR gate P4 of which the inputs are connected to the Q outputs of the two flip-flops B4, B5.

The gate P5 is also connected by a control input and via an inverter I3 to an enable signal input VA. The flip-flops B4 and B5 are thus disabled if the enable signal VA is absent.

The integrator circuit comprises four resistors R4 to R8 and a capacitor C4 connected between points K1 and K2.

The resistor R5 is connected between the Q output of the flip-flop B4 and point K1.

The resistor R6 is connected between the Q' output of the flip-flop B5 and the point K1.

The resistor R7 is connected between the Q' output of the flip-flop B4 and the point K2.

The resistor R8 is connected between the Q output of the flip-flop B5 and the point K2.

The point K1 is connected to the output S1 of the comparator by a resistor R9 and the point K2 to the output S2 by a resistor R10. A resistor R11 is connected between the output S1 and ground.

Thus in the case where, for example, the signal appearing at E1 is in advance of the signal at E2, the comparator operates in the following manner:
 in the absence of any signal at E1 and E2 it is in a quiescent state,
 on the appearance of a signal at E1, the flip-flop B4 is activated and the capacitor C4 charges, the point K1 being positive relative to the point K2,
 on the appearance of a signal at E2 the flop-flop B5 is activated, the flip-flops B4 and B5 reset to zero and the capacitor C4 is charged,
 on disappearance of the signal at E1 the flip-flop B5 is again activated and the capacitor C4 is charged with the opposite polarity,
 on disappearance of the signal at E2 the capacitor C4 is discharged and the comparator returns to the quiescent state.

Figure 5:
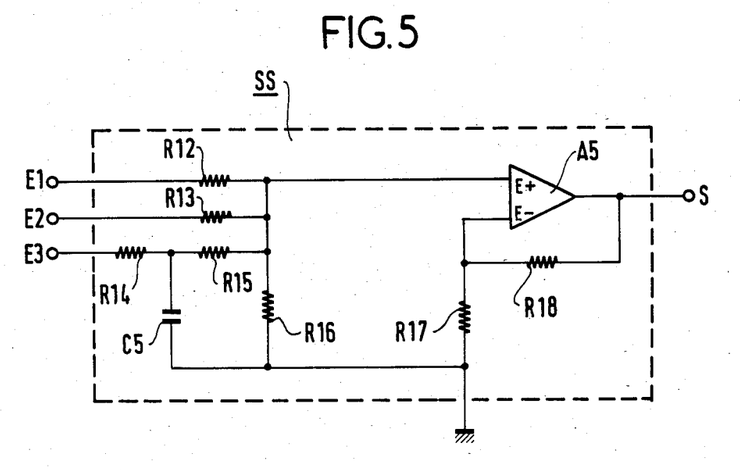
FIG. 5 shows a three-input summing circuit.

A summing circuit SS is shown in FIG. 5. It comprises a differential amplifier A5 of which the positive input E+ is connected to the input E1 of the circuit by a resistor R12, to the input E2 by a resistor R13 and to the input E3 by two series-connected resistors R14-R15. The common point of resistors R14 and R15 is connected to ground by a capacitor C5, and the positive input E+ is also connected to ground, by a resistor R16.

The negative input E— is connected to ground by a resistor R17 and to the output S of the circuit by a resistor R18. Finally, the output of the amplifier A5 is connected to the output S.

This circuit comprises the weighted sum of the internal synchronization signal AI, the external synchronization signal AE and the calibration signal AR. In particular, the stability required of the oscillator requires that the internal synchronization signal AI take clear precedence. For example, if the signal Sk is cut off or reconnected, there may be any relative phase value at the input of the comparator CP2. Modification of the signals AE and AR will vary the oscillator frequency in order to make good this new phase difference. This frequency variation must remain extremely limited if the clock signal provided by the generator is not to be degraded.

Figure 6:
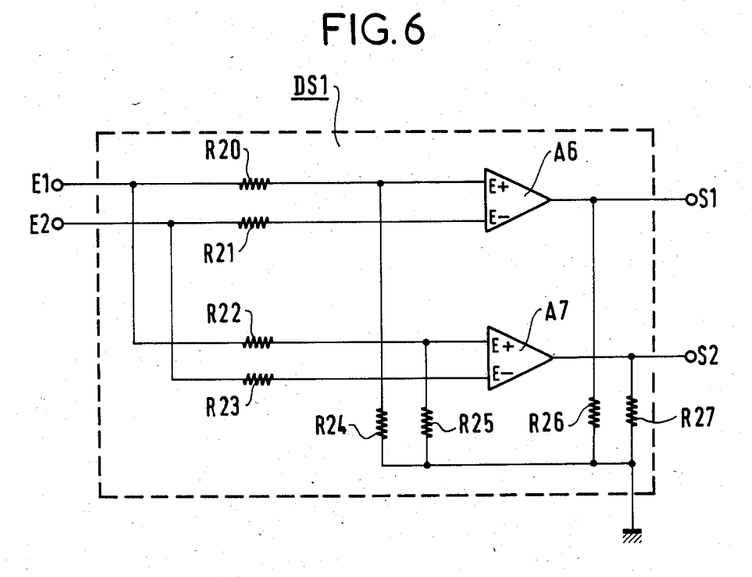
FIG. 6 is a schematic diagram of a differential threshold detector.

FIG. 6 shows one embodiment of a threshold detector DS1 comprising two differential amplifiers A6 and A7.

The inputs E1 and E2 of the detector are respectively connected to the inputs E+ and E− of the amplifiers by resistors R20 to R23. The inputs E+ and E− are connected to ground by resistors R24 and R25. The outputs of the amplifiers are connected to ground by resistors R26 and R27 and to the outputs S1 and S2 of the detector.

Figure 7:
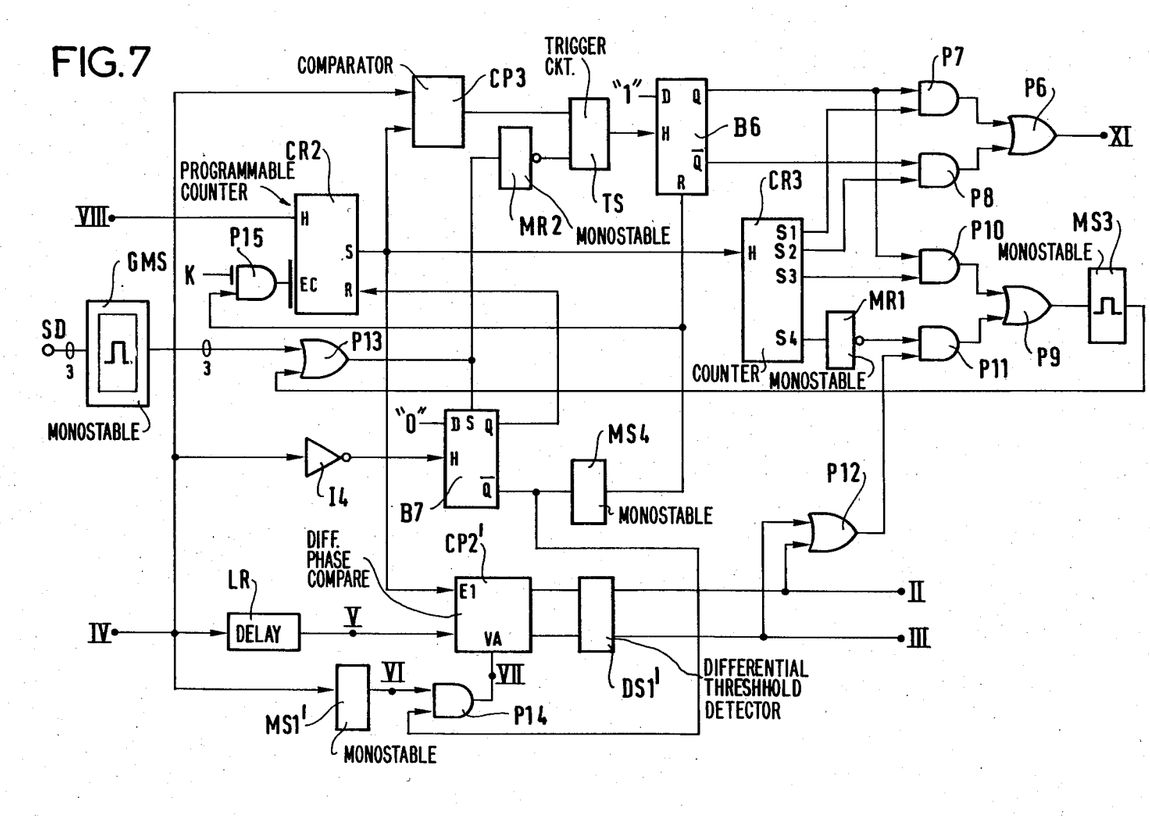
FIG. 7 relates to an alternative embodiment intended to complement a generator as shown in FIG. 2.

There will now be described the application of the invention to a network utilizing an external synchronization link with back-up. FIG. 7 shows a system associated with the timebase shown in FIG. 2 in order to process a supplementary external link of this kind, referred to as a signaling link, and to achieve fast phase correction and calibration.

The points II, III, IV, VIII and XI are connected to the corresponding points in FIG. 2, the links IV-V, VI-VII and IX-X of FIG. 2 are cut, a delay line LR is inserted points IV and V, and a gate P14 is inserted between points VI and VII, as shown in FIG. 7.

The units CP2′, DS1′ and MS1′ indicated on FIG. 7 are in fact the same as the units CP2, DS1 and MS1 shown in FIG. 2, and the divider DF1 of FIG. 2 is dispensed with.

The 8 kHz local synchronization signal is provided by a programmable counter CR2 (FIG. 7) operating as a frequency divider from the 4 MHz signal provided at point VIII by the divider DF (FIG. 2). The output of the counter CR2 drives one input of the comparator CP2′, a supplementary comparator CP3 and another counter CR3 with four outputs s1 to s4. The second input of the comparator CP3 is connected to the output of the interface IE (FIG. 2) via the point IV.

The counter CR3 provides for selecting via the point XI two different periods for transmission of pulses by the monostable MS2 (FIG. 2) and two periods for phase correction of the counter CR2, selection being controlled by a type D flip-flop B6. The input of the monostable MS2 is connected via the point XI to the output of an OR gate P6 driven by two AND gates P7 and P8.

The gate P7 is connected to the Q output of the flip-flop B6 and to the output s1 of the counter, whereas the gate P8 is connected to the outputs $\overline{Q}$ and s2, respectively, of these same units.

Likewise, the outputs s3 and s4 drive a monostable MS3 via an OR gate P9 and AND gates P10 and P11. Gate P10 is controlled by the Q output of the flip-flop B6. The gate P11 is connected to the output s4 of the counter CR3 by a monostable MR1 operating as a time-delay and is controlled by the outputs of the threshold detector DS1′ through the intermediary of an OR gate P12.

To provide for the processing of changes of clock of the external synchronization signal Sk0 from the external synchronization clock there is associated with the latter a signaling link SD connected to a group CMS of monostables. The link SD comprises, for example, three pairs of wires respectively indicating:
switchover to the remote standby clock,
return to the remote standard clock,
complete cutting off of the remote clock.

Each of these links controls one monostable of the group GMS, and the output of each monostable is connected to an OR gate P13 which is also controlled by the monostable MS3. The comparator CP3 has a single output which is activated above a pre-determined value of the absolute phase difference between the signals applied to its two inputs. The output of the comparator is connected to a trigger circuit TS which drives the clock input H of the flip-flop B6. The D input of the flip-flop is maintained at logic "1". The trigger circuit TS is controlled by a monostable MR2 operating as a time-delay, activated by the output of the gate P13. The comparator CP3 is activated above a phase difference threshold significantly higher than that of the detector DS1, four times higher, for example.

A type D flip-flop B7 is associated with the flip-flop B6 for the purposes of controlling the operating phases of the system.

The flip-flop B7 is activated by the output of the gate P13 connected to its input S and is reset to zero on the falling edge of signal Sk0. Its D input is maintained at logic "0" and the clock input H is connected to the point IV by an inverter I4.

The Q output of this flip-flop is connected to the reset input R of the counter CR2.

The $\overline{Q}$ output of the flip-flop B7 controls:
the enable input of the comparator CP2′ via an AND gate P14 also controlled by the monostable MS1′,
the reset input of the flip-flop B6 through the intermediary of a monostable MS4,
the loading of the counter CR2 with a value K which corresponds to synchronization with the falling edge of the external synchronization signal Sk0 (the counter load input Ec receives the value K wired by a group of AND gates P15 controlled by the outputs of the monostable MS4).

Finally, a delay line LR connects the point IV to the input of the comparator CP2.

OPERATION (1) In normal operation without calibration, the detector DS1′ not being activated, the flip-flops B6 and B7 remain quiescent and the system has no effect on the oscillator.

(2) If there is a slight phase difference to which the detector DS1′ responds but not the comparator CP3, the flip-flop B6 remains quiescent and its $\overline{Q}$ output authorizes low-speed control via the output s2 of the counter CR3 of the monostable MS2 which increments or decrements the counter CR1.

When the output s4 is activated, and following the time-delay introduced by the monostable MR1, the monostable MS3 is activated and triggers the flip-flop B7 of which the Q output goes to logic "1" and resets to zero the counter CR2. The $\overline{Q}$ output of the flip-flop B7 goes to logic "0" and disables the comparator CP2′ via the gate P14.

The arrival of the falling edge of the signal Sk0 resets the flip-flop B7 and activates the comparator CR2 and the monostable MS4 which instigates loading of the counter CR2 with the value K.

The phase difference is cancelled out and if the voltage correction applied to the oscillator by the counter CR1 is not sufficient, then drift will occur again and a further calibration cycle will be carried out.

(3) If the phase difference is higher and the comparator CP3 is activated, the start of the cycle is the same as in the previous case.

The pulse sent by the monostable MS3 triggers the trigger circuit TS after the time-delay introduced by the monostable MR2. The flip-flop B6 is activated and its output selects the fast operating cycle, controlled by the outputs s1 and s3 of the counter CR3.

After one cycle the flip-flop B6 is returned to the quiescent condition and a further fast cycle occurs only if the phase difference is again above the triggering threshold of the comparator CP3.

(4) In the event of external clock switchover, one of the monostables of the group GMS is activated and activates the flip-flop B7. The counter CR2 is thus reset and restarts in phase with the falling edge of the signal Sk0 as in the previous cases, and irrespective of the phase difference introduced by the switchover.

The monostable MR2 is activated and introduces a time-delay to enable the signal Sk to stabilize after switchover, before the indication from the comparator CP3 is acted on. Subsequent operation is as in one of the preceding cases, according to whether or not there is any drift relative to the new external clock.

(5) If the synchronization signal Sk0 is completely cut off, the output of the flip-flop B7 activated by a monostable of the group GMS remains at logic "1". The counter CR2 and the comparator CP2 are disabled. The system is disabled and the oscillator remains locked in the condition prevailing before cut-off. The generators remain internally synchronized and the timebase operates autonomously, that is to say with only the internal synchronization between generators.

It is also of benefit to be able to synchronize the timebase with various types of external link, selection being effected from an operator console, for example.

In accordance with the invention, there is provided an interface system connected to external links with differing characteristics and, in each case, distributing the signals Sk0 to Sk2 and SD to the timebase.

Figure 8:
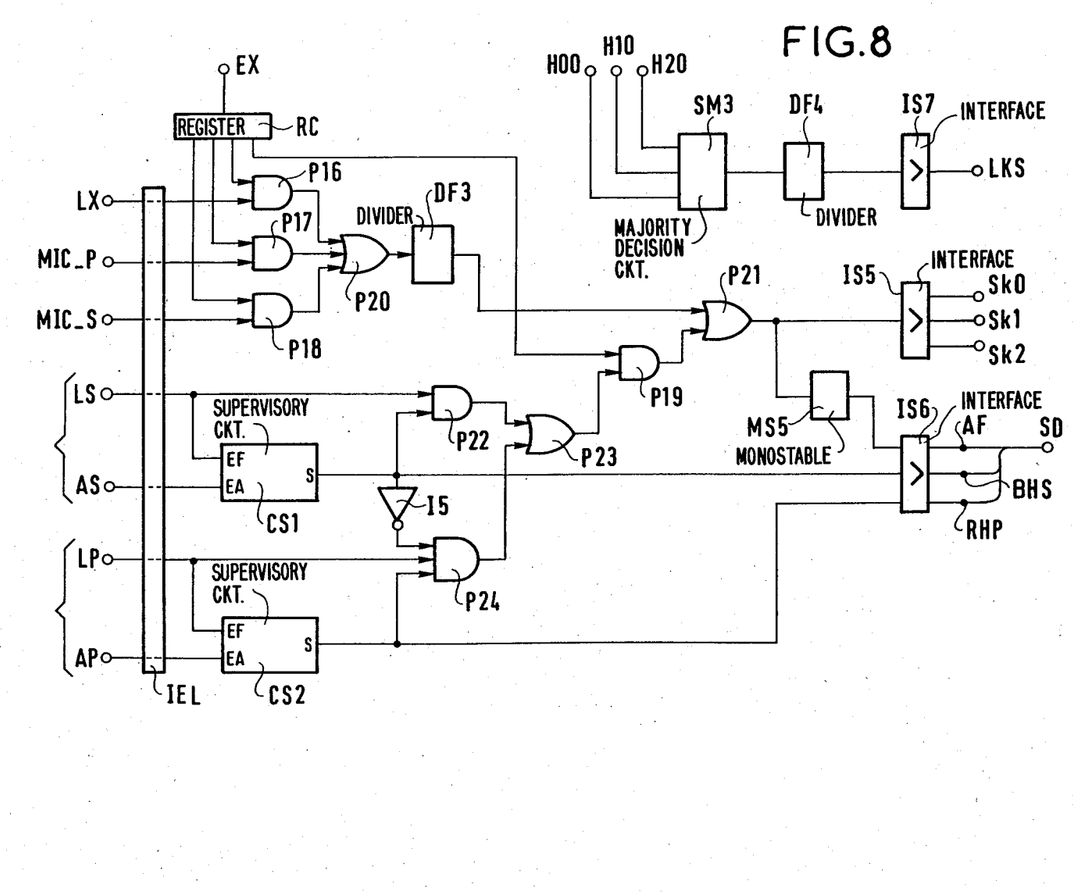
FIG. 8 shows an external synchronization interface.

By way of example, there will be described hereinafter (FIG. 8) an interface receiving three types of synchronization signal:

Signals at a frequency of 8 kHz received over a primary link LP and a secondary link LS. With each of these links there is associated a respective alarm link AP, AS of which a change in state indicates a link fault. The primary link has priority over the secondary link.

Signals at a frequency of 2.048 MHz received over PCM links MIC-P, MIC-S to European standards.

A signal at 2.048 MHz received over a dedicated link LX, for example, a high-precision clock transmitted over a regional or national synchronization network.

All these links are connected to an input interface IEL. The link to be used is selected by means of a register RC of which the outputs control access gates P16 for the link LX, P17 for the link MIC-P, P18 for the link MIC-S and P19 for the links LS and LP. For the links LX and MIC, a change of link is effected by commanding the register.

The outputs of the gates P15 to P18 are connected by an OR gate P20 to a frequency divider DF3 which outputs a signal at 8 kHz.

The register RC is loaded via its input EX, from a control console or computer interface, for example.

The synchronization signals Sk0 to Sk2 are provided by an output interface IS5 of which the input is connected to the output of an OR gate P21 connected to the output of the divider DF3 and to the output of the gate P19.

The signals from the link LS reach the gate P19 through an AND gate P22 controlled by a supervisory circuit CS1 and an OR gate P23.

Likewise, the signals from the link LP pass through the gate P23 and an AND gate P24 which is controlled by a supervisory circuit CS2 identical to CS1 and by an inverter I5 connected to the output of the circuit CS1. The commanding of the gate P24 by the inverter I5 effects the link changes.

The link SD is obtained at the output of an interface IS6 which provides:

The signal BHS for changing over to the standby clock in response to the output of the circuit CS1 going to logic "0".

The signal FHP for returning to the primary clock in response to the output of the circuit CS2 going to logic "0".

The cut-off signal AF corresponding to absence of any signal, which is determined by a monostable MS5 activated by the gate P19 via the gate P21. The time constant of the monostable MS5 is two the three times the period, 300 microseconds, for example.

Figure 9:
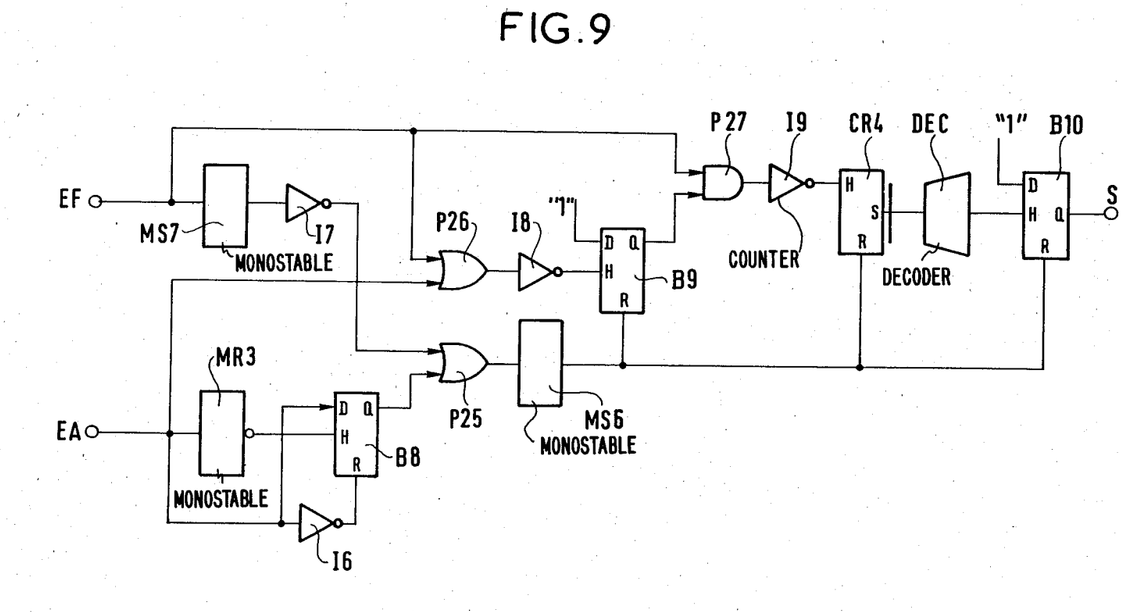
FIG. 9 is a schematic diagram of a supervisory circuit.

The supervisory circuits CS1 and CS2 are identical (FIG. 9). The supervisory circuit CS1 has two inputs EF and EA one of which is connected to the synchronization link LS or LP and the other of which is connected to the alarm link AS or AP. The function of these circuits is to produce a changeover signal (BHS or BHP) in response to the presence of an alarm at the input AS or AP or the absence of the signal of frequency on the links LS or LP.

The input EA of a supervisory circuit (FIG. 9) is connected to a time-delay MR3 which controls the clock input of a type D flip-flop B8. The input EA is also connected to the D input of the flip-flop and to an inverter I6 which controls the reset input R. The Q output of the flip-flop thus follows the state on the input EA except in the case of signals with a duration which is less than the time constant of the time-delay, which are considered to be spurious and eliminated.

The flip-flop B8 controls a monostable MS6 via an OR gate P25. The function of the monostable MS6 is to maintain stable switchover control even if the input EA signal is subject to oscillation or instability.

The input EF is connected to a monostable MS7 which controls the gate P25 via an inverter I7. The monostable MS7 is maintained activated by the signal present at the input EF and in the event of disappearace of this signal it reverts to the quiescent state and activates the monostable MS6.

The input EF is also connected to an OR gate P26 and to an AND gate P27. The gate P26 controls the clock input of a flip-flop B9 via an inverter I8. The gate P27 controls the clock input of a counter CR4 via an inverter I9.

The Q output of the flip-flop B9 controls the gate P27. The output of the counter CR4 is connected to a decoder DEC. The output of the decoder DEC, which in this instance corresponds to step 8 of the counter CR4, controls the clock input of a flip-flop B10 of which the Q output is connected to the S output of the circuit CS1. The output of the monostable MS6 controls the reset input R of the flip-flops B9 and B10 and the counter CR4. Finally, the gate P26 is also controlled by the input EA.

The supervisory circuits CS1, CS2 operate as follows:

As has already been mentioned, in response to an alarm signal As or AP appearing on one of the inputs ER or in response to cutting off of the signals of frequency on the links LS or LP at one of the inputs EF, the corresponding monostable MS6 is activated and sets to zero the flip-flop B10 and thus the output S of the circuit of which it forms part.

If there has been an alarm, on disappearance of the alarm signal AS or AP from the input EA concerned, the corresponding gate P26 is enabled. The corresponding flip-flop B8 is reset to zero and the corresponding monostable MS6 is de-activated. The output S of the supervisory circuit concerned is reactivated after the counter CR4 and the decoder DEC of this circuit have counter eight pulses. This counting offers improved security on resumption of external synchronization.

If the signal was cut off with no alarm indication, then restarting occurs under the same conditions after eight pulses.

Operation is as follows in the case of a fault on the links MIC-P, MIC-S, LX:

The disappearance of the synchronization signal causes the monostable MS5 to change state and generates the signal SD.

Another link is selected by commanding the register RC either from an operator console or automatically if the register is controlled by a computer.

Finally, the timebase described is also suitable for the situation in which there is a requirement for synchronization with return, the timebase having to retransmit over a link LKS to a remote center a control signal of the same frequency as the synchronization signal which it receives.

In the example described, the return corresponding to the link LX is effected by a majority decision circuit SM3 receiving the clock signals H00, H10, H20 which it passes on to a frequency divider DF4. The output of the divifer DF4 is connected to the link LKS via an output interface IS7.

It will be understood that various changes in the details, materials and arrangement of parts, which have been herein described and illustrated in order to explain the nature of the invention, may be made by those skilled in the art within the principle and scope of the invention as expressed in the appended claims.

We claim:

1. A multi-generator externally synchronized timebase including a plurality of generators each generating first clock signals and individual output synchronization signals, each generator in said timebase comprising:
    a voltage-controlled oscillator (OS) for generating a first clock signal (HA) in accordance with a control input;
    a first voter (SM1) for deriving a majority clock signal from the individual first clock signals (Hij) respectively generated in each generator of said timebase;
    a second voter (SM2) for deriving an output synchronization signal (SL) from the individual output synchronization signals (Sij) respectively generated in each generator of said timebase;
    a first differential phase comparator (CP2) having a first input for receiving an external synchronization signal (Sk0) and a second input for receiving the derived output synchronization signal (SL);
    a second differential phase comparator (CP1) having a first input for receiving said derived majority clock signal and a second input for receiving an output signal (HA or HB) from said voltage controlled oscillator;
    a calibration circuit including a threshold detector (DS1) connected to an output of said first differential phase comparator (CP2), a first trigger circuit (CDE) responsive to said derived output synchronization signal (SL) and to outputs of said threshold detector for providing trigger circuit outputs, and a calibration voltage adjustment circuit (CRT) receiving said trigger circuit outputs and providing a calibration voltage adjustment circuit output; and
    a summing circuit (SS) having a first input receiving said calibration voltage adjustment circuit output, a second input receiving an output of said first differential phase comparator circuit and a third input receiving an output of said second differential phase comparator circuit, said summing circuit providing an output to said control input of said voltage controlled oscillator.

2. A timebase according to claim 1, further comprising a programmable counter operating as a divider and having a clock input connected to said voltage-controlled oscillator and an output delivering the timebase output signal to said first phase comparator which is also connected to receive said external synchronization signal, whereby in the event that a predetermined phase difference threshold is exceeded said counter is restarted from a programmed value which yields a null phase difference.

3. A timebase according to claim 2, comprising a link supplying said external synchronization signal, a signaling link adapted to indicate characteristic states of said external synchronization signal and supplying said external synchronization signal and a group of monostables, said first trigger circuit including an adjustment pulse trigger monostable and two control gates connected between the outputs of said threshold detector and the inputs of said first counter, the output of said adjustment pulse trigger monostable being connected to the inputs of said control gates, and wherein said generator further comprises:
    a further comparator (CP3) having inputs connected to receive the output signal of said programmable counter and said external synchronization signal and an output adapted to produce a signal for a phase difference exceeding a threshold which is higher than that of said threshold detector,
    a second trigger circuit (TS) having an input connected to said further comparator and having a further input connected to the output of a monostable of said group via an OR gate and a time-delay monostable (MR2), and
    an adjustment pulse transmission period select counter (CR3) having an output connected to the input of said adjustment pulse trigger monostable in parallel with said second trigger circuit (TS) via a set of logic gates (P6 to P8).

4. A timebase according to claim 1, wherein:

said calibration voltage adjustment circuit comprises
  a counter having incrementing and decrementing
  inputs each receiving a trigger circuit output, and a
  digital-to-analog converter having inputs selectively connected to outputs of said counter
  wherein said digital-to-analog converter has an
  output connected to said first input of said summing circuit, to permit temporary storage of said
  calibration voltage, and
said first trigger circuit comprises a divider connected to receive at least one signal derived from
  the output of said voltage controlled oscillator, two
  control gates connected between the outputs of
  said threshold detector and the inputs of said
  counter, and a monostable connected to an output
  of said divider and controlling said control gates.

5. A timebase according to claim 1, comprising a threshold control circuit connected to the output of said first differential phase comparator and adapted to control the input of said calibration voltage adjustment circuit, said threshold control circuit being adapted to inhibit the input of said calibration voltage adjustment circuit when the phase difference threshold exceeds a predetermined value which is higher than the threshold of said detector, whereby external synchronization is inhibited if said signal is affected by drift exceeding a fixed value.

* * * * *